United States Patent

Guduri et al.

(10) Patent No.: US 12,422,873 B2
(45) Date of Patent: Sep. 23, 2025

(54) BIAS GENERATION FOR BRIDGE DRIVER LOAD CURRENT SENSING

(71) Applicant: Texas Instruments Incorporated, Dallas, TX (US)

(72) Inventors: Venkatesh Guduri, Bangalore (IN); Ganapathi Shankar, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 210 days.

(21) Appl. No.: 18/240,734

(22) Filed: Aug. 31, 2023

(65) Prior Publication Data

US 2025/0076909 A1   Mar. 6, 2025

(51) Int. Cl.
*G05F 1/56* (2006.01)
*G05F 1/575* (2006.01)
*G05F 3/26* (2006.01)
*H03K 17/082* (2006.01)
*H03K 17/10* (2006.01)
*H03K 17/687* (2006.01)

(52) U.S. Cl.
CPC .............. *G05F 1/575* (2013.01); *G05F 3/262* (2013.01); *H03K 17/0822* (2013.01); *H03K 17/102* (2013.01); *H03K 17/687* (2013.01)

(58) Field of Classification Search
CPC ..... G05F 1/575; G05F 3/262; H03K 17/0822; H03K 17/102; H03K 17/687
See application file for complete search history.

(56) References Cited

U.S. PATENT DOCUMENTS

| 2019/0020323 | A1* | 1/2019 | Schulz | G05F 3/22 |
| 2020/0001906 | A1* | 1/2020 | Bramucci | B61L 15/0072 |
| 2021/0359647 | A1* | 11/2021 | Shaik | H03F 3/45475 |

OTHER PUBLICATIONS

"DRV8844 Quad 1/2-H-Bridge Driver IC," Datasheet SLVSBA2D (Texas Instruments Incorporated, 2016).
"Optimized H-Bridge Driver Control for Stepper and Brushed-DC (BDC) Motors Using MSPMO MCUs," Application Brief SLAAE92 (Texas Instruments Incorporated, Mar. 2023).
"Integrated FETs vs External FETs: Performance Comparison of Motor Drivers," Application Note SLOA328 (Texas Instruments Incorporated, Dec. 2022).

(Continued)

*Primary Examiner* — Adolf D Berhane
*Assistant Examiner* — Afework S Demisse
(74) *Attorney, Agent, or Firm* — Mandy Barsilai Fernandez; Frank D. Cimino

(57) ABSTRACT

A load current sensing circuit includes a sense leg including a sense transistor with a gate coupled to the output of a high-side gate driver, a feedback transistor, and a sense resistor coupled in series between a power supply and ground. An amplifier has differential inputs coupled to the sense leg and to an output, and an output coupled to the feedback transistor gate. A bias circuit has a first transistor coupled between the power supply voltage and the first bias voltage terminal, and a gate receiving, from a first leg, a first differential from the output voltage. A second leg in the amplifier bias circuit generates a gate voltage, for a second transistor coupled between ground and a second bias voltage terminal, that is at a second differential from a voltage at the first bias voltage terminal. The amplifier is biased between the first and second bias voltages.

20 Claims, 8 Drawing Sheets

(56) References Cited

OTHER PUBLICATIONS

Duque-Carrillo et al., "1-V Rail-to-Rail Operational Amplifiers in Standard CMOS Technology," J. Solid-State Circ., vol. 35, No. 1 (IEEE, 2000), pp. 35-44.
Pardoen et al., "A rail-to-rail input/output CMOS power amplifier," J. Solid-State Circ., vol. 25, No. 2 (IEEE, 1990), pp. 501-504.
Botma et al., "A low-voltage CMOS op amp with a rail-to-rail constant-g/sub m/ input stage and a class AB rail-to-rail output stage," Intl. Symp. on Circ.and Sys. (ISCAS), vol. 2 (IEEE, 1993), pp. 1314-1317.
Huang et al., "A low-voltage CMOS rail-to-rail operational amplifier using double p-channel differential input pairs," Intl. Symp. on Circ.and Sys. (ISCAS) (IEEE, 2004), pp. 1-673-1-676.

\* cited by examiner

BIAS GENERATION FOR BRIDGE DRIVER LOAD CURRENT SENSING

BACKGROUND

This specification relates to current sensing circuitry in bridge driver circuits. More particularly, this specification relates to the generation of bias voltages in such current sensing circuitry.

Output stages of power electronics circuits such as motor drivers, power converters, and the like commonly include paired power transistors for driving a load coupled to an output terminal. One of the paired power transistors (e.g., the "high-side" transistor) drives the output terminal from a positive or high-voltage power supply voltage. A second power transistor (e.g., the "low-side" transistor) drives the output terminal to ground or to a negative power supply voltage. The high-side and low-side transistors are generally driven in a non-overlapping manner. This output stage configuration may be referred to as a push-pull, synchronous buck, or half-bridge configuration. In many applications, a pair of half-bridge drivers drive opposite ends of the load (e.g., a motor coil). This paired arrangement is often referred to as a full bridge driver.

Half-bridge and full bridge drivers can drive a load with relatively high currents (e.g., on the order of several amperes) from relatively high voltages (e.g., 40V to 60V). In such high-voltage and high-current implementations, the driver transistors may be constructed as field-effect transistors (FETs), including metal-oxide-semiconductor FETs (MOSFETs), in technologies suitable for the expected voltages and currents. Examples of these "power" FETs include laterally-diffused MOSFETs (LDMOS), drain-extended MOSFETs (DEMOS), vertically-diffused MOSFETs (VMOS), and the like.

In some applications such as automotive applications, continuous sensing and monitoring of the load current sourced or sunk by half-bridge drivers is useful. FIG. 1A illustrates an example of half-bridge driver circuitry including load current sensing, as constructed according to the prior art. Driver circuitry 100 includes half-bridge 101 including high-side n-channel power FET 102 with its drain at power supply VM and its source at output terminal OUT, and low-side n-channel power FET 104 with its drain at output terminal OUT and its source at circuit ground. Load 150 is coupled to output terminal OUT, and constitutes the load of the driver circuit. The gate of high-side power FET 102 is driven by gate drive signal HSGATE from high-side gate driver 112, for example in response to a control signal HSON. The gate of low-side power FET 104 is driven by gate drive signal LSGATE from low-side gate driver 114, for example in response to a control signal LSON. Control circuitry (not shown) provides control signals HSON, LSON to apply the desired voltage and current to load 150.

For sensing of the load current driven by half-bridge 101, driver circuitry 100 includes n-channel sense FET 122 with its drain coupled to power supply VM and its gate receiving gate drive signal HSGATE from high-side gate driver 112. Sense FET 122 may be scaled in transistor size relative to high-side power FET 102, for example to be smaller by a factor 1/M. The source of sense FET 122, at node OUT_SNS, is coupled to the source of p-channel feedback FET 124. The drain of feedback FET 124 is coupled to circuit ground through resistor 126. Differential operational amplifier (op amp) 125 has a negative input coupled to node OUT_SNS and a positive input coupled to node OUT in half-bridge 101. An output A_OUT of op amp 125 is coupled to the gate of feedback transistor 124.

In this arrangement, sense FET 122 is effectively mirrored with high-side power FET 102, as its drain and gate are at the same voltages as high-side power FET 102. The current conducted by sense FET 122 thus corresponds to the current driven by high-side FET 102, e.g., scaled by the ratio 1/M. Op amp 125 responds to differences in the voltage at nodes OUT, OUT_SNS by controlling its output voltage A_OUT applied to the gate of feedback FET 124, so that the voltage at node OUT_SNS matches the voltage at output terminal OUT. In this condition, a voltage IPROPI across resistor 126 provides a measure of the load current source by high-side FET 102. Voltage IPROPI may be forwarded to control circuitry (not shown).

In many applications, for example automotive applications, half-bridge 101 provides rail-to-rail output drive, requiring that n-channel high-side power FET 102 drive output terminal OUT fully to power supply voltage VM. To do so, high-side gate drive signal HSGATE must be at a voltage that is at least the threshold voltage of high-side FET above power supply voltage VM. In driver circuitry 100 of FIG. 1A, charge pump 115 provides a pumped bias voltage VCP above power supply voltage VM to high-side gate driver 112. High-side gate driver 112 is thus able to output high-side gate drive signal HSGATE at a sufficiently high voltage that high-side power FET 102 can drive output terminal OUT fully to power supply voltage VM.

In these rail-to-rail applications of half-bridge 101, op amp 125 must also support rail-to-rail operation because its input voltages can range from circuit ground to power supply voltage VM. Some prior art rail-to-rail implementations bias op amp 125 with a charge-pumped voltage, for example from charge pump 115. In other prior art implementations, op amp 125 includes complementary n-channel and p-channel differential input pairs and is biased from power supply voltage VM.

FIG. 1B illustrates op amp 125 and amplifier bias circuit 130 according to another prior art implementation. In this example, op amp 125 includes p-channel MOS input transistors 142, 144 with sources coupled in common to current source 140 and drains coupled to amplifier load circuit 146. The gate of transistor 142 is coupled to output terminal OUT, and the gate of transistor 144 is coupled to node OUT_SNS. Amplifier load circuit 146 is also coupled to output terminal OUT, and presents the output of op amp 125 at node A_OUT, which is coupled to the gate of feedback FET 124 (FIG. 1A). Amplifier load circuit 146 may be constructed to include a current mirror load coupled to input stage transistors 142, 144, level shifting circuitry, output drive amplification circuitry, etc.

In this example, current source 140 in op amp 125 is biased from supply node SUP_P. The voltage at this supply node SUP_P is generated by amplifier bias circuit 130. Amplifier bias circuit 130 includes current source 132 biased from a charge-pumped voltage above power supply voltage VM, for example as generated by charge pump 115. Current source 132 is coupled in series with resistor 134 between power supply voltage VCP and output terminal OUT of half-bridge 101. N-channel MOS transistor 136 has its drain coupled to pumped voltage VCP at the output of charge pump 115, and its gate coupled to a node between current source 132 and resistor 134. Amplifier bias circuit 130 outputs a bias voltage at supply node SUP_P to op amp 125 from the source of transistor 136.

SUMMARY

According to an example, a circuit includes a gate driver, a sense transistor biased from a power supply terminal that has a gate coupled to the output of the gate driver, and a feedback transistor and a sense resistor coupled in series with the sense transistor between the power supply terminal and a reference voltage terminal. An amplifier has a first input terminal coupled to an output terminal of the circuit, a second input terminal coupled to a node between the sense transistor and the feedback transistor, and an output coupled to the gate of the feedback transistor. The amplifier is biased between first and second bias terminals. An amplifier bias circuit includes a first transistor having a first terminal coupled to the power supply terminal and a second terminal coupled to the first bias terminal of the amplifier. A first current source and a first resistor are coupled at a node coupled to the gate of the first transistor. The first current source and first resistor are coupled in series between the power supply terminal and the output terminal. The amplifier bias circuit also includes a second transistor having a first terminal coupled to the first bias terminal of the amplifier and a second terminal coupled to the reference voltage terminal. A second resistor and a second current source are coupled at a node coupled to the gate of the second transistor, and are coupled in series between the second terminal of the first transistor and the gate terminal of the second transistor.

According to another example, a method of sensing load current from a half-bridge driver circuit includes driving a high-side driver and a sense transistor with a gate voltage from a high-side gate driver, and conducting current from the sense transistor to a reference potential through a feedback transistor and a sense resistor. The method further includes generating a first amplifier bias voltage corresponding to a voltage at an output of the high-side driver plus a first selected differential, generating a second amplifier bias voltage corresponding to the first amplifier bias voltage minus a second selected differential, and biasing an operational amplifier from the first and second amplifier bias voltages. A feedback gate voltage is generated from an output of an operational amplifier, the operational amplifier having a positive input coupled to a half-bridge driver output and a negative input coupled to a node between the sense transistor and the feedback transistor. A voltage at the sense resistor is output.

According to another example, a load current sensing circuit includes a high-side gate driver, and a sense leg including a sense transistor, a feedback transistor, and a sense resistor coupled in series between a power supply voltage and a reference voltage, the sense transistor having a gate coupled to the output of the high-side gate driver. An operational amplifier has first and second bias voltage terminals, a first input coupled to the sense leg, a second input coupled at an output terminal, and an output coupled to a gate of the feedback transistor. An amplifier bias circuit includes a first leg configured to generate a first gate voltage at a first differential from a voltage at the output terminal; a first transistor, coupled between the power supply voltage and the first bias voltage terminal, and having a gate receiving the first gate voltage from the first leg; a second leg configured to generate a second gate voltage at a second differential from a voltage at the first bias voltage terminal; a second transistor, coupled between the reference potential and the second bias voltage terminal, and having a gate receiving the second gate voltage from the second leg; and a third resistor coupled between the first and second bias voltage terminals.

Technical advantages enabled by one or more of these examples include load current sensing circuitry that has an improved common mode rejection ratio (CMRR). The load current sensing circuitry can be efficiently implemented, because bias circuitry for an amplifier included in the load current sensing circuitry need not be biased with a charge-pumped voltage. In addition, the amplifier bias circuitry can maintain a relatively low bias voltage across the amplifier, enabling the amplifier input transistors to be constructed as low-voltage devices, thus limiting capacitance in the amplifier signal path.

Other technical advantages enabled by the disclosed examples will be apparent to those of ordinary skill in the art having reference to the following specification together with its drawings.

BRIEF DESCRIPTION OF THE DRAWINGS

The same reference numbers or other reference designators are used in the drawings to illustrate the same or similar (in function and/or structure) features.

DETAILED DESCRIPTION

In many applications, half-bridge and full bridge driver circuits are called upon to drive loads with high load currents (e.g., on the order of amperes) at rail-to-rail voltages on the order of tens of volts, and in some cases ranging up to 100V. Load current sensing in such high-power applications presents particular challenges. One such challenge is in providing proper bias to the current sensing amplifier (e.g., a differential op amp). Biasing the current sensing amplifier from a charge pump, as in some prior art implementations, is costly from a chip area and power consumption standpoint, especially in high bandwidth applications, and can require high-voltage input stage transistors in the current sensing amplifier. Other prior art implementations in which both n-channel and p-channel input pairs are used in the current sensing amplifier to attain rail-to-rail operation also necessitate the use of high-voltage devices. These high-voltage input transistors can present stability issues due to the additional capacitance in the signal path. Furthermore, internal voltages in the current sensing amplifiers vary significantly with the voltage at output terminal OUT in each of these prior art approaches. This dependence on output voltage degrades the common mode rejection ratio (CMRR) of the current sensing circuitry.

Figure 1A:
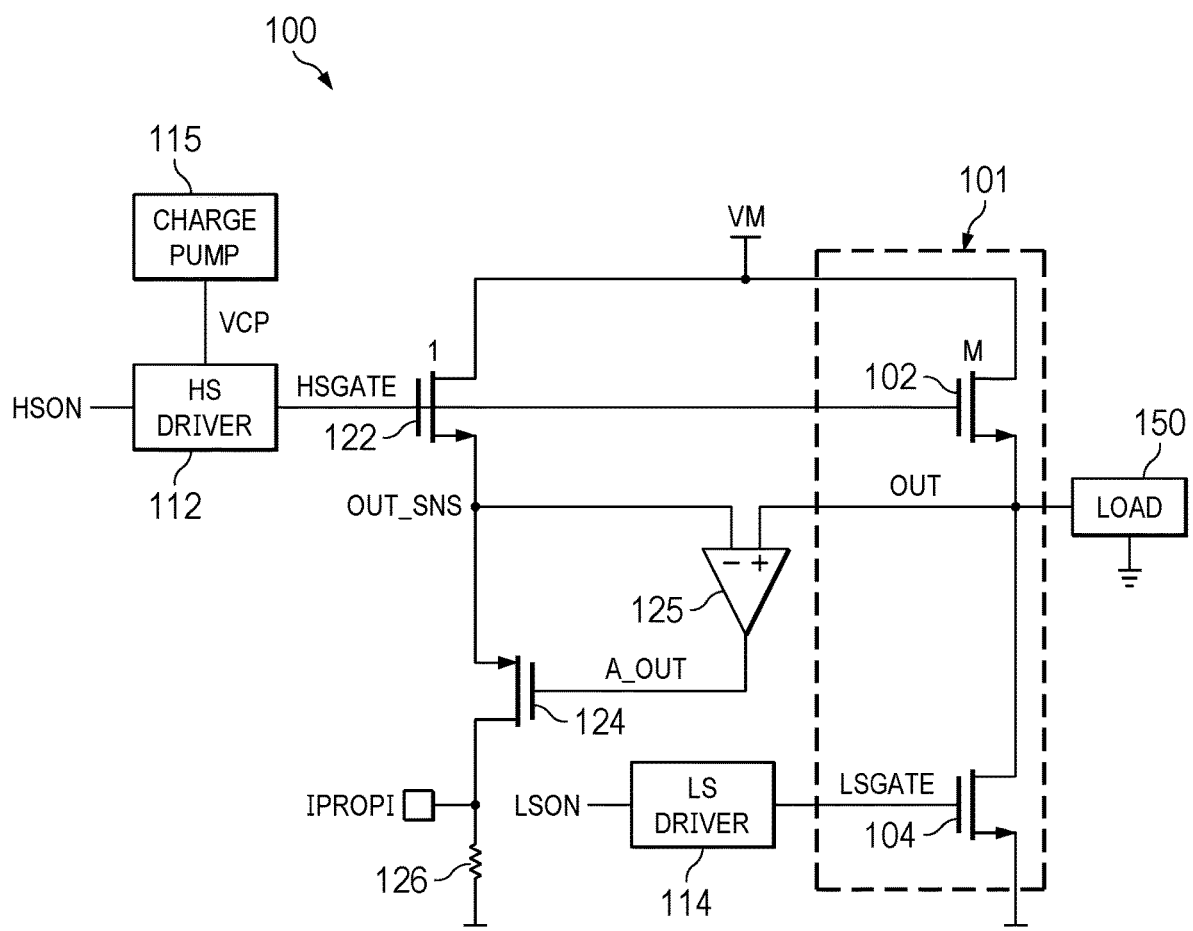
FIG. 1A is an electrical diagram, in schematic form, of a prior art half-bridge driver circuit with current sensing.
Figure 1B:
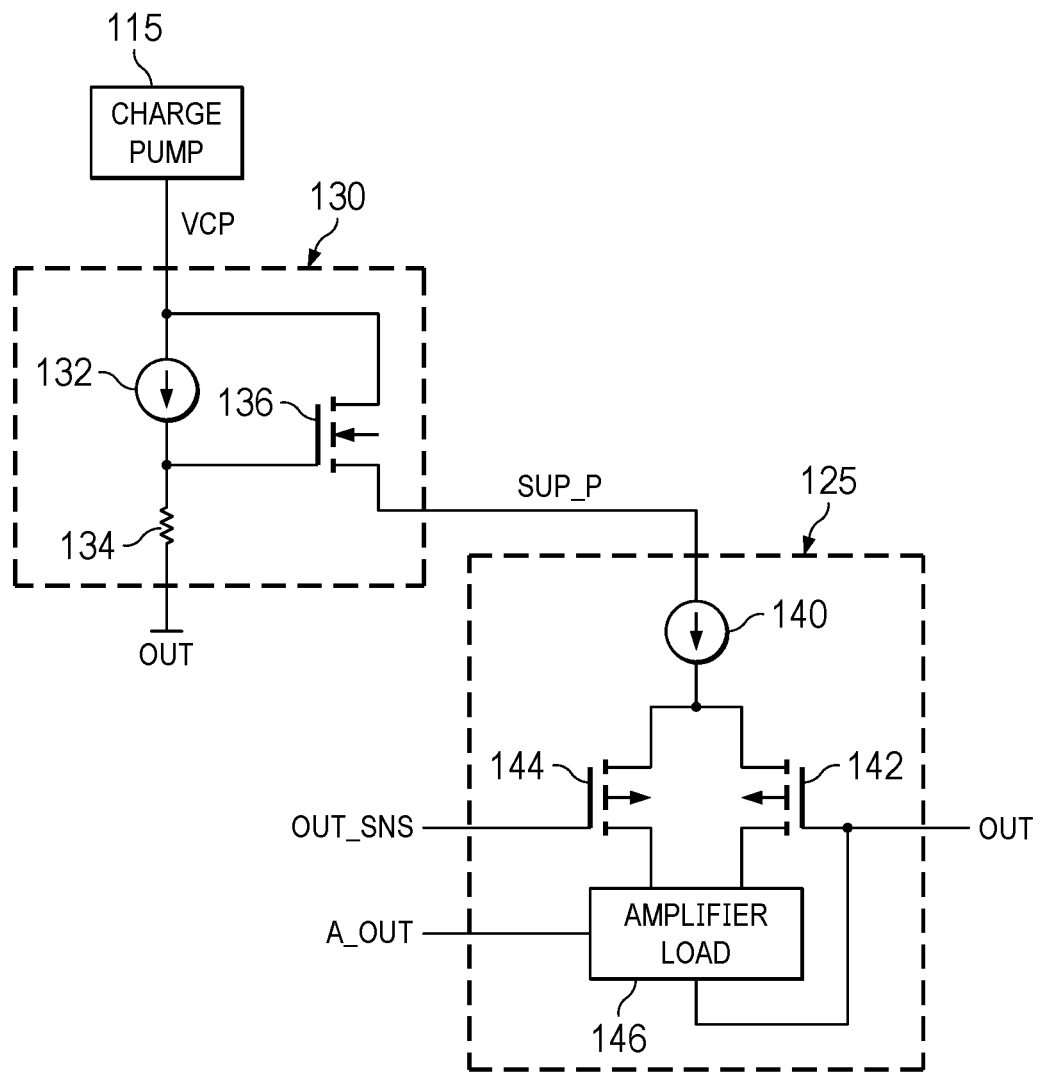
FIG. 1B is an electrical diagram, in schematic form, of a prior art operational amplifier and its bias circuitry in the arrangement of FIG. 1A.

Referring to the prior art example shown in FIG. 1B, op amp 125 is biased between the voltage at output terminal OUT and supply voltage SUP_P as generated by amplifier bias circuitry 130. In amplifier bias circuitry 130, current source 132 conducts a regulated current $I_{b1}$ through resistor 134 (of resistance $R_{134}$), raising the voltage at the gate of transistor 136 to a fixed voltage ($I_{b1} \cdot R_{134}$) (e.g., 5V) above the voltage $V_{OUT}$ at output terminal OUT. At this gate bias, amplifier bias circuitry 130 presents a positive bias voltage to amplifier 125 at about the voltage $V_{OUT}$ plus the voltage drop across resistor 134 minus the threshold voltage $V_t$ of transistor 136. In order to support rail-to-rail operation, however, amplifier bias circuitry 130 must itself be biased with a charge pump voltage above power supply voltage VM (e.g., voltage VCP from charge pump 115). As noted above, the use of a charge pump to bias amplifier bias circuitry 130 can be costly in chip area and power consumption. It is within this context that the examples described herein arise.

One or more examples are described in this specification as implemented into half-bridge driver circuitry, as it is contemplated that such implementation is particularly advantageous in that context. However, it is also contemplated that these examples may be beneficially applied in other applications, for instance full bridge driver circuits, push-pull and synchronous buck circuits, and others.

Figure 2:
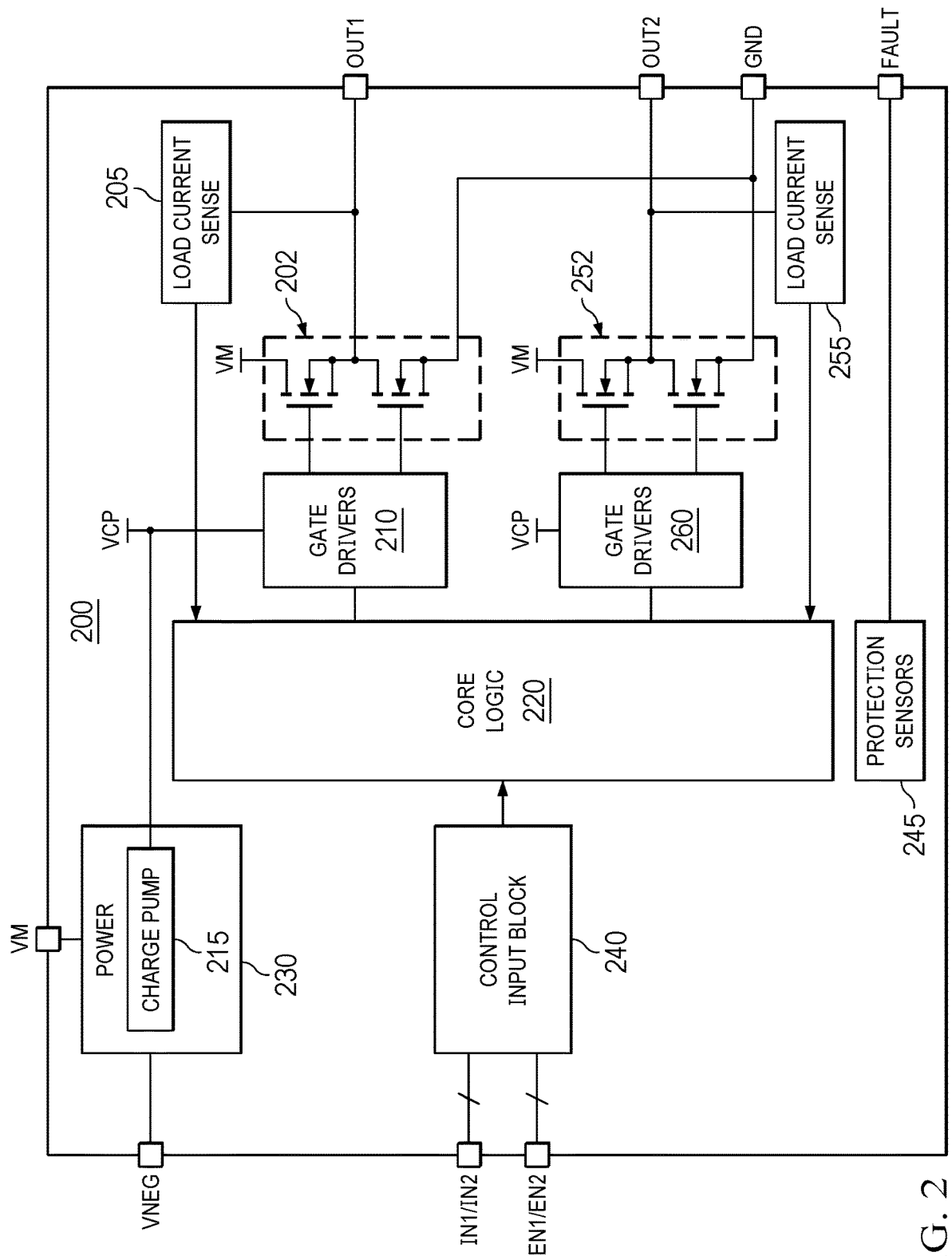
FIG. 2 is an electrical diagram, in block form, of an example integrated half-bridge driver integrated circuit according to an example.

FIG. 2 illustrates an example dual half-bridge driver integrated circuit 200 constructed. Integrated circuit 200 includes two integrated half-bridge drivers 202, 252, gate drivers 210, 260, and load current sensing circuits 205, 255. Integrated circuit 200 includes core logic 220, control input block 240, protection sensors 245, and power management circuitry 230 including charge pump 215.

In this example of FIG. 2, half-bridge drivers 202, 252 are integrated into the same integrated circuit as the other listed circuit elements. Alternatively, half-bridge drivers 202, 252 may be implemented externally to the integrated circuit that includes core logic 220, gate drivers 210, 260, etc. Other circuit functions may additionally be included within integrated circuit 200. Alternatively, some of the circuit functions shown in the example of FIG. 2 may be realized in separate integrated circuits.

Each of half-bridge drivers 202, 252 in this example includes n-channel power FETs with source/drain paths coupled in series between a power supply potential (e.g., power supply voltage VM) and a reference potential (e.g., circuit ground). Gate drivers 210 have outputs coupled to the gate terminals of the power FETs in half-bridge driver 202, and gate drivers 260 have outputs coupled to the gate terminals of the power FETs in half-bridge driver 252. Half-bridge 202 drives output terminal OUT1 from a node coupled between its power FETs. Half-bridge 252 drives output terminal OUT2 from a node coupled between its power FETs. Two half-bridge drivers 202, 252 are included in or with integrated circuit 200 in this example. However, more or fewer half-bridge drivers may be implemented in or with integrated circuit 200.

Control input block 240 has inputs coupled to input terminals of integrated circuit 200, to receive control signals from a host computer or controller external to integrated circuit 200. In this example, the control signals include input and enable signals IN1, EN1 for half-bridge driver 202, and input and enable signals IN2, EN2 for half-bridge driver 252. Control input block 240 includes input buffers, filters, level shifters, and in some cases logic circuitry, to generate control signals of the appropriate syntax and format for application to core logic 220.

Core logic 220 in integrated circuit 200 has inputs coupled to outputs of control input block 240. Core logic 220 may be implemented as logic circuitry, such as including programmable, custom, or semi-custom digital logic circuitry. Core logic 220 generates control signals (e.g., high-side control signal HSON and low-side control signal LSON). Responsive to these control signals, gate drivers 210, 260 turn on the high-side and low-side power FETs in half-bridges 202, 252, respectively, as appropriate to drive output terminals OUT1, OUT2.

Power management circuit 230 includes voltage regulators and related circuitry for generating the appropriate bias voltage levels for the functions of integrated circuit 200. As such, power management circuit 230 has inputs coupled to power supply terminals receiving a positive power supply voltage VM and a negative or ground voltage VNEG. In this example, charge pump 215 in power management circuit 230 generate a pumped bias voltage VCP, above power supply voltage VM. This pumped bias voltage VCP biases gate drivers 210 and 260 in integrated circuit, enabling half-bridge drivers 202, 252 to drive output terminals OUT1, OUT2 rail-to-rail between power supply voltage VM and ground.

Protection sensors 245 in integrated circuit 200 include monitoring circuitry for detecting fault conditions such as overtemperature, overcurrent, and undervoltage. In this example, protection sensors 245 have an output coupled to fault terminal FAULT at which indications of fault conditions can be signaled to the host system or other external circuitry.

In this example, each of half bridges 202, 252 is associated with corresponding load current sensing circuit 205, 255, respectively. Load current sensing circuit 205 has an input coupled to output OUT1 of half-bridge driver 202. Load current sensing circuitry 255 has an input coupled to output OUT2 of half-bridge driver 252. Load current sensing circuit 205, 255 each have outputs coupled to core logic 220, for communicating signals indicating measurements of the load current as sensed.

Figure 3:
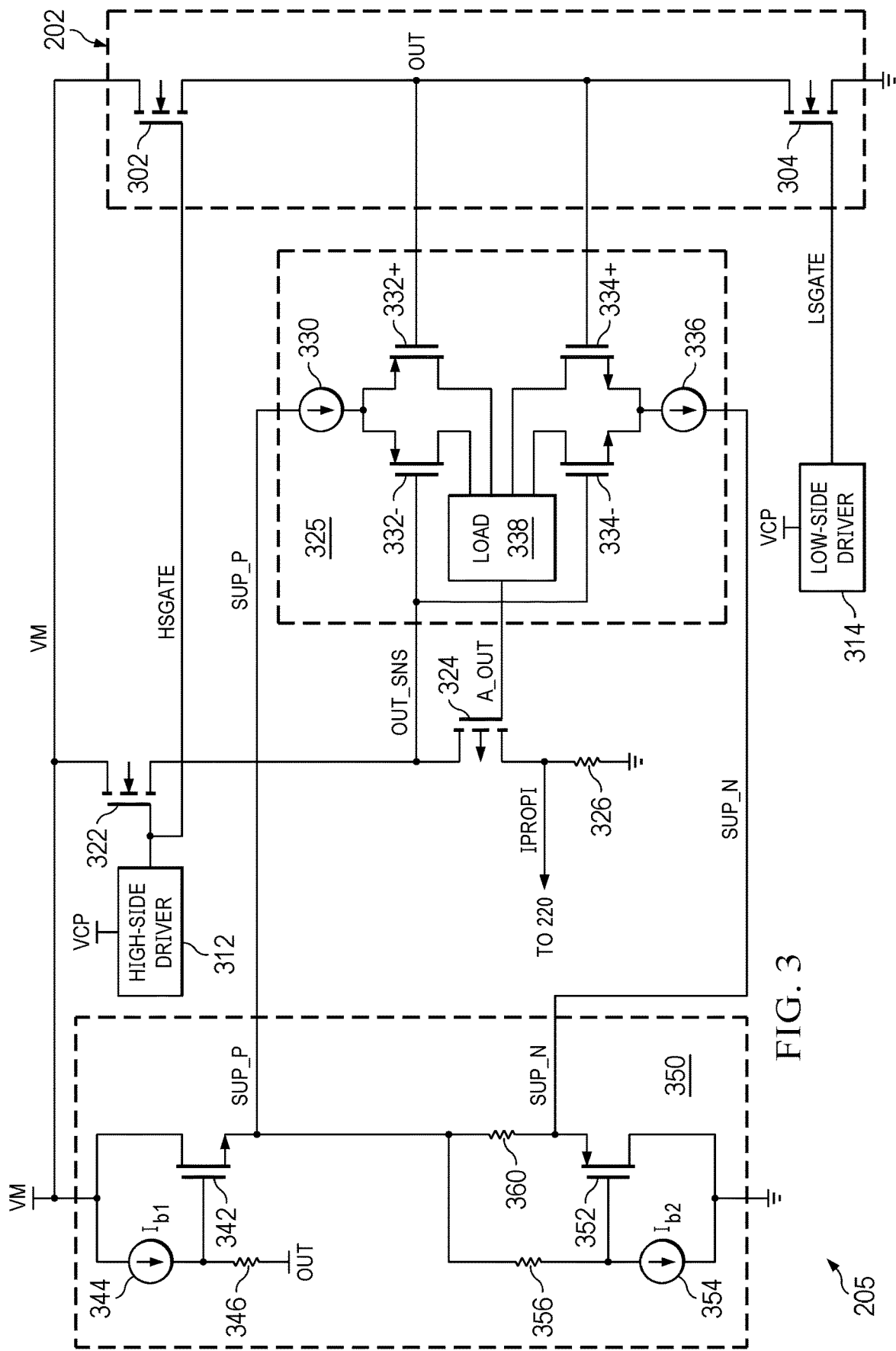
FIG. 3 is an electrical diagram, in schematic form, of an example current sensing circuitry with amplifier bias circuitry in the integrated circuit of FIG. 2.

FIG. 3 illustrates an example load current sensing circuit 205 in the integrated circuit 200 of FIG. 2. Load sensing circuit 205 is shown in FIG. 3 in context with half-bridge 202. Load sensing circuitry 255 associated with half-bridge 252 of integrated circuit 200 may be similarly implemented. Half-bridge 202 includes n-channel power FETs 302, 304, and is shown in FIG. 3 with high-side gate driver 312 and low-side gate driver 314.

Load sensing circuit 205 as shown in FIG. 3 includes n-channel sense transistor 322, p-channel feedback transistor 324, resistor 326, amplifier 325, and amplifier bias circuit 350. Amplifier 325 includes current sources 330, 336, n-channel input transistors 332+, 332−, p-channel input transistors 334+, 334−, and amplifier load 338. Amplifier bias circuit 350 includes n-channel transistor 342, p-channel transistor 352, current sources 344, 354, and resistors 346, 356, 360. Transistors 324, 342, 332+, 332−, 334+, 334−, and 352 may each be implemented as FETs, for example MOSFETs.

High-side n-channel power FET 302 in half-bridge 202 has a drain coupled at a power supply terminal VM (the voltage at which is referred to herein as power supply voltage VM), a source coupled to output terminal OUT (corresponding to output terminal OUT1 in the dual half-bridge arrangement of FIG. 2), and a gate coupled to an output of high-side gate driver 312 to receive gate drive signal HSGATE. Low-side n-channel power FET 304 has a drain coupled to output terminal OUT, a source coupled to a reference potential (e.g., circuit ground), and a gate coupled to an output of low-side gate driver 314 to receive gate drive signal LSGATE. In this example, power supply voltage VM may be on the order of 40V to 60V, or in some implementations as high as on the order of 100V. As such, power FETs 302 and 304 may be implemented as high-voltage devices, for example according to technologies such as laterally-diffused MOSFETs (LDMOS), drain-extended MOSFETs (DEMOS), vertically-diffused MOSFETs (VMOS), and the like. High-side gate driver 312 and low-side gate driver 314 are both biased from a charge-pumped voltage VCP generated by charge pump 215 (FIG. 2).

N-channel sense transistor 322 has a drain coupled to power supply voltage VM and a gate coupled to the output of high-side gate driver 312 to receive gate drive signal HSGATE. The size, and thus the current drive, of sense transistor 322 may be scaled from that of high-side power FET 302 by a factor 1/M, such that under the same bias conditions, sense transistor 322 conducts a current that is a factor of 1/M smaller than that conducted by high-side power FET 302. The source of sense transistor 322 is coupled to the source of p-channel feedback transistor 324 at node OUT_SNS. Feedback transistor 324 has a drain coupled to circuit ground through sense resistor 326 in this example, and a gate coupled to an output A_OUT of amplifier 325. Sense transistor 322 and feedback transistor 324 may be constructed as high-voltage devices.

Amplifier 325 has a positive input coupled to output terminal OUT and a negative input coupled to node OUT_SNS at the sources of sense transistor 322 and feedback transistor 324, and its output A_OUT coupled to the gate of feedback transistor 324. In this example, amplifier 325 is biased between bias node SUP_P and bias node SUP_N. Amplifier 325 includes complementary differential input transistor pairs of p-channel input transistors 332+, 332− and n-channel input transistors 334+, 334−. Current source 330 is coupled between bias node SUP_P and the sources of p-channel input transistors 332+, 332−, and current source 336 is coupled between bias node SUP_N and the sources of n-channel input transistors 334+, 334−. Input transistors 332+ and 334+ have gates coupled to output terminal OUT, and input transistors 332− and 334− have gates coupled to node OUT_SNS. Amplifier load 338 is coupled to the drains of input transistors 332+, 332−, 334+, 334−, and is constructed for differential operational amplifiers. In an example, amplifier load 338 includes a current mirror load coupled to input transistors 332+, 332−, 334+, 334−, level shifting circuitry, output drive amplification circuitry, etc. In this example, amplifier load 338 generates a voltage at amplifier output A_OUT in response to a differential voltage at inputs OUT, OUT_SNS.

In this example, sense transistor 322, feedback transistor 324, resistor 326, and amplifier 325 form a negative feedback loop. In this negative feedback loop, amplifier 325 regulates the voltage at the gate of feedback transistor 324 to minimize the differential voltage appearing at the inputs OUT, OUT_SNS to amplifier 325. As a result, load current output by half-bridge 202 from output terminal OUT is sensed by load current sensing circuit 205. A measure of that sensed load current appears as the voltage IPROPI across sense resistor 326 (relative to circuit ground in this example). This voltage IPROPI is provided to logic circuitry 220 or elsewhere in integrated circuit 200.

More particularly, the gate and drain of load current sensing sense transistor 322 receive the same voltages (gate drive signal HSGATE from high-side gate driver 312 and power supply voltage VM, respectively) as the gate and drain of high-side power FET 302. Amplifier 325 responds to differential voltage across output terminal OUT and node OUT_SNS by providing a voltage at its output A_OUT, at the gate of p-channel feedback transistor 324. Amplifier 325 is configured in this example such that a positive differential voltage at the inputs of amplifier 325 increases the gate voltage of feedback transistor 324, reducing its conduction and thus raising the voltage at node OUT_SNS. Conversely, a negative differential voltage at the inputs of amplifier 325 decreases the gate voltage of feedback transistor 324, increasing its conduction and thus reducing the voltage at node OUT_SNS. Accordingly, the feedback loop including amplifier 325 operates to equalize the voltage at node OUT_SNS to match that at output terminal OUT. In this steady-state condition, the voltage at the source of sense transistor 322 is the same as the voltage at the source of high-side power FET 302. Thus, the current conducted by sense transistor 322 corresponds to the load current conducted by high-side power FET 302, scaled by the factor 1/M of their relative sizes. Voltage IPROPI across sense resistor 326 thus provides a measure of the load current conducted at output terminal OUT.

As mentioned above, amplifier 325 is biased between a voltage at bias node SUP_P and a lower voltage at bias node SUP_N. The voltages at these bias nodes SUP_P and SUP_N are produced from amplifier bias circuit 350 according to this example.

N-channel transistor 342 in amplifier bias circuit 350 has a drain coupled to power supply voltage VM, and a source coupled to bias node SUP_P. A first leg of amplifier bias circuit 350 includes current source 344 and resistor 346 (having a resistance $R_{346}$) connected in series between power supply voltage VM and output terminal OUT. Current source 344 is coupled to power supply voltage VM and resistor 346 is coupled to output terminal OUT. The gate of transistor 342 is coupled to a node between current source 344 and resistor 346. A second leg of amplifier bias circuit 350 includes current source 354 and resistor 356 (having a resistance $R_{356}$) connected in series between circuit ground and bias node SUP_P. Current source 354 is coupled to circuit ground and resistor 356 is coupled to bias node SUP_P. P-channel transistor 352 in amplifier bias circuit 350 has a drain coupled to circuit ground and a gate coupled to a node between current source 354 and resistor 356. Resistor 360 is coupled between bias node SUP_P and the source of transistor 352, at bias node SUP_N. Current sources 344 and 354 may be controlled by reference voltages (e.g., from power management circuitry 230) to conduct regulated currents $I_{b1}$ and $I_{b2}$, respectively.

In operation, the voltage drop across resistor 346 from regulated current $I_{b1}$ conducted by current source 344 from power supply voltage VM establishes a voltage at the gate of n-channel transistor 342 that is a regulated voltage ($I_{b1} \cdot R_{346}$) above the voltage $V_{OUT}$ currently at output terminal OUT. The voltage at the source of transistor 342 (at bias node SUP_P) is thus at a voltage $V_{OUT}$-($I_{b1} \cdot R_{346}$) minus the threshold voltage of transistor 342 itself. In some examples, n-channel transistor 342 may be implemented as a "native" transistor, with a threshold voltage substantially at 0V. Accordingly, amplifier bias circuit 350 in this example generates a bias voltage $V_{SUP\_P}$ at bias node SUP_P that is at a regulated (or effectively fixed) differential above the voltage $V_{OUT}$ currently at output terminal OUT of half-bridge 202. Bias voltage $V_{SUP\_P}$ thus varies with variations in output voltage $V_{OUT}$.

Similarly, the voltage drop across resistor 356 from regulated current $I_{b2}$ conducted by current source 354 from bias node SUP_P establishes a voltage at the gate of transistor 352 that is a regulated voltage ($I_{b2} \cdot R_{356}$) below bias voltage $V_{SUP\_P}$ currently at bias node SUP_P. The voltage at the source of transistor 352 (at bias node SUP_N) is thus at a voltage $V_{SUP\_P}$-($I_{b2} \cdot R_{356}$) plus the threshold voltage of transistor 352 itself (e.g., about +1V). Resistor 360 conducts current from bias node SUP_P to bias node SUP_N to conduct any excess current (in excess of regulated current $I_{b2}$) to circuit ground through transistor 352. Accordingly, amplifier bias circuit 350 generates a bias voltage $V_{SUP\_N}$ at bias node SUP_N that is at a regulated (or effectively fixed) differential below the bias voltage $V_{SUP\_P}$ currently at bias node SUP_P. Because bias voltage $V_{SUP\_P}$ varies with output voltage $V_{OUT}$, bias voltage $V_{SUP\_N}$ also varies with output voltage $V_{OUT}$.

Figure 4A:
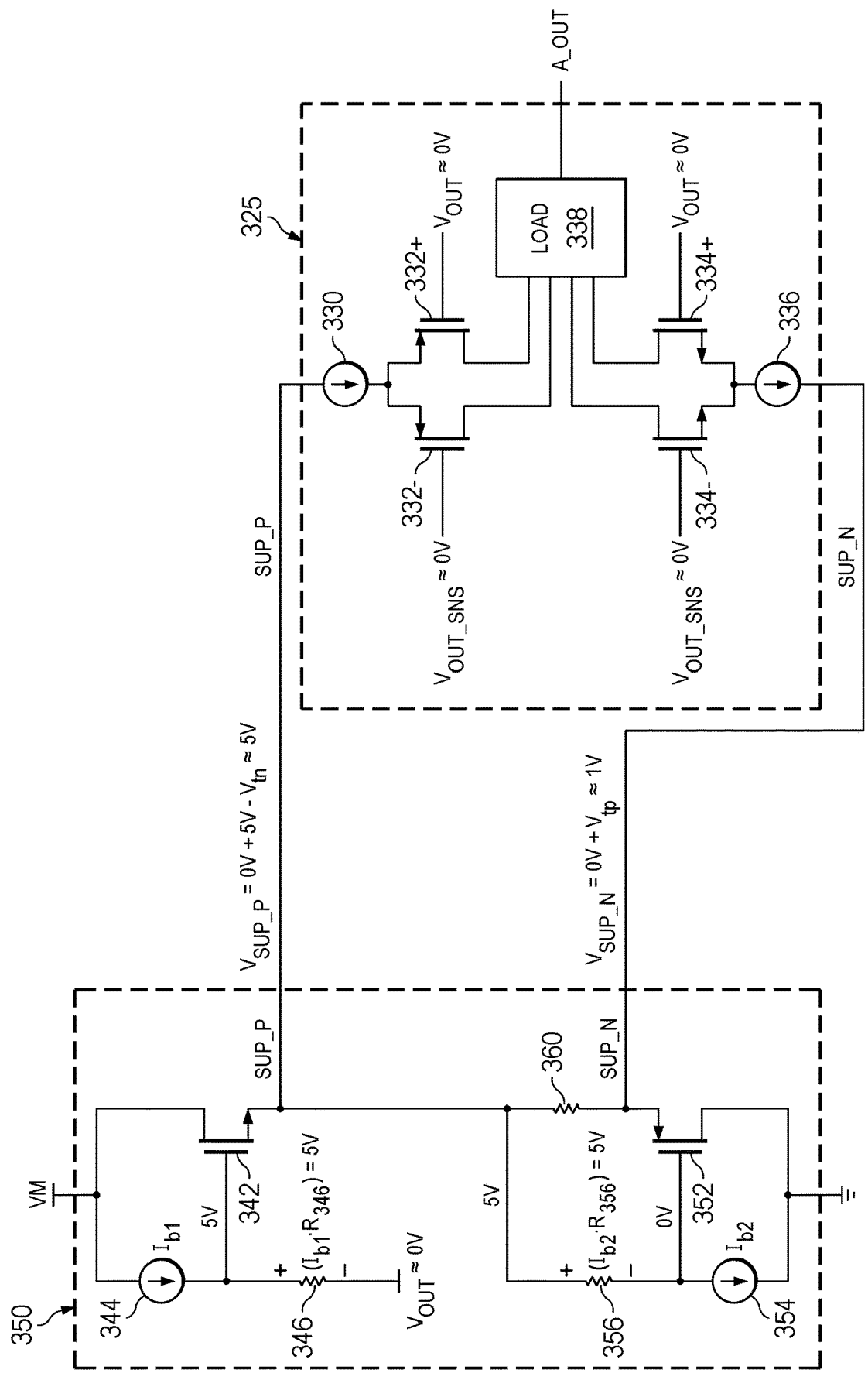
FIG. 4A and FIG. 4B are electrical diagrams, in schematic form, illustrating example operation of the current sensing circuitry of FIG. 3.
Figure 4B:
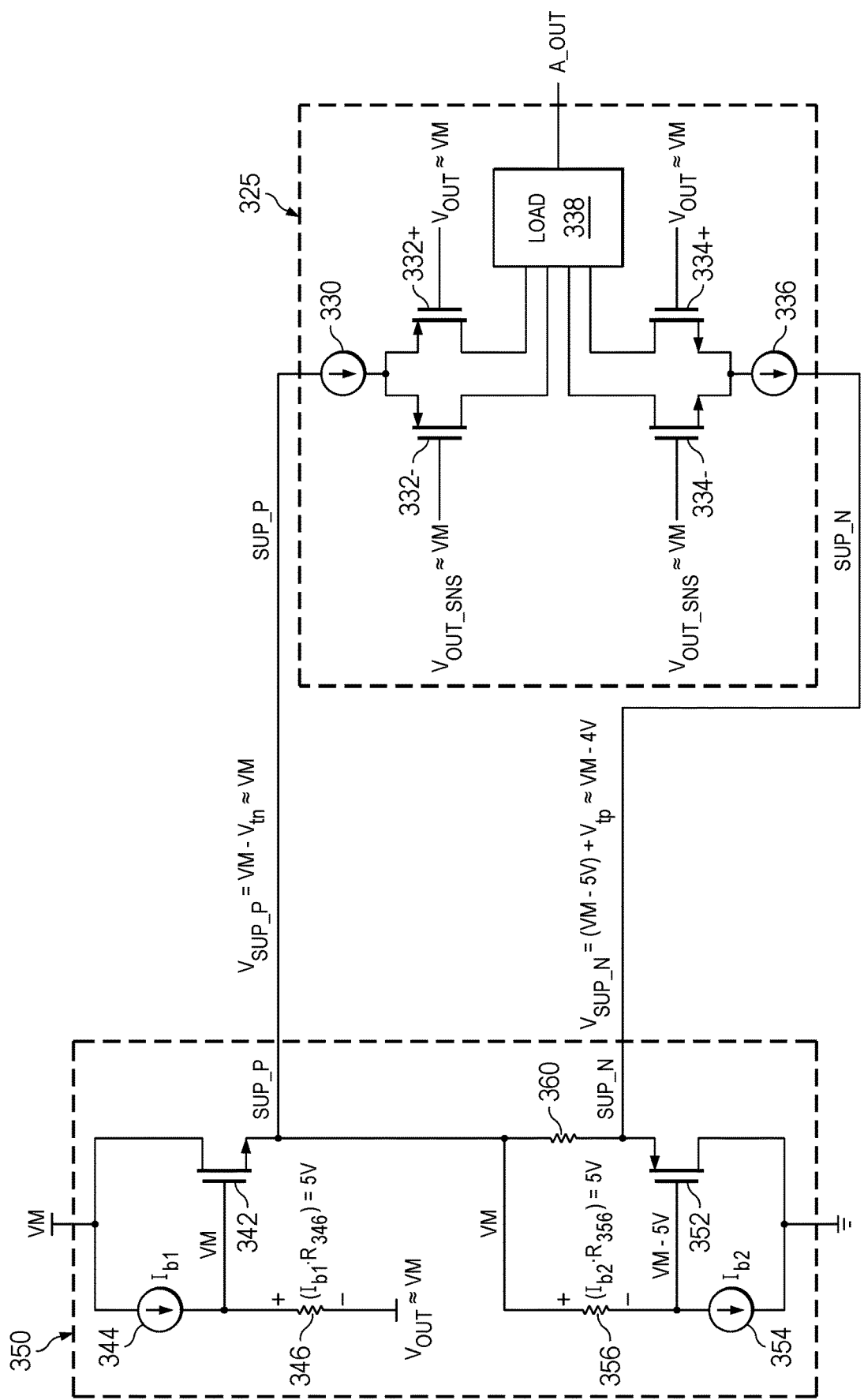

The operation of amplifier bias circuit 350 for the cases of output voltage $V_{OUT}$ from half-bridge 202 at relatively low and relatively high levels is illustrated in FIGS. 4A and 4B, respectively. In both of the examples of FIGS. 4A and 4B, the regulated currents $I_{b1}$ and $I_{b2}$ sourced by current sources 344 and 354, respectively, and the resistances $R_{346}$ and $R_{356}$ of resistors 346 and 356, respectively, are selected so that the voltage drops ($I_{b1} \cdot R_{346}$) and ($I_{b2} \cdot R_{356}$) are each about 5V.

The example of FIG. 4A illustrates the operation of amplifier bias circuit 350 for the case in which the voltage $V_{OUT}$ at output terminal OUT is near circuit ground (e.g., 0V). As described above relative to FIG. 3, the feedback loop in current sensing circuit 205 operates to equalize the voltage at node OUT_SNS with that at output terminal OUT. For a voltage drop ($I_{b1} \cdot R_{346}$) across resistor 346 of about 5V, the voltage at the gate of n-channel transistor 342 is 5V above voltage $V_{OUT}$, and thus at about 5V in this example of $V_{OUT} \approx 0V$. N-channel transistor 342 is turned on by this gate bias, and conducts drain-to-source current from power supply voltage VM (e.g., +40V) to bias node SUP_P, clamping the gate-to-source voltage of transistor 342 to the threshold voltage $V_{tn}$. For transistor 342 implemented as an n-channel native transistor, having a threshold voltage $V_{tn}$ of about 0V, bias voltage $V_{SUP\_P}$ at bias node SUP_P is thus at about 5V in this example ($V_{SUP\_P} = V_{OUT} + (I_{b1} \cdot R_{346}) - V_{tn}$, which evaluates to 0V+5V−0V).

The voltage $V_{SUP\_N}$ at bias node SUP_N is based on the voltage $V_{SUP\_P}$ at bias node SUP_P in this example. With a voltage drop ($I_{b2} \cdot R_{356}$) across resistor 356 of 5V, the voltage at the gate of p-channel transistor 352 is 5V below voltage $V_{SUP\_P}$, and is thus at about 0V in this example. Transistor 352 is turned on by this gate bias, and conducts current from bias node SUP_P to circuit ground through resistor 360. The voltage at the source of transistor 352, and thus at bias node SUP_N, is clamped by transistor 352 to a threshold voltage $V_{tp}$ of transistor 352 above the gate voltage of 0V. For the example of a threshold voltage $V_{tp}$ of 1V, the voltage $V_{SUP\_N}$ at bias node SUP_N is thus about 1V.

Amplifier bias circuit 350 thus biases amplifier 325 between a bias voltage $V_{SUP\_P}$ of about 5V, and a bias voltage $V_{SUP\_N}$ of about 1V. At this differential amplifier bias of about 4V, input transistors 332+, 332−, 334+, 334− of amplifier 325 may be implemented as low-voltage MOS transistors, for instance similar to logic transistors elsewhere in integrated circuit 200 (e.g., suitable for bias voltages on the order of 5V).

Conversely, the operating example shown in FIG. 4B corresponds to half-bridge 202 outputting a voltage $V_{OUT}$ at about the level of power supply voltage VM (e.g., +40V). The feedback loop including amplifier 325 in current sensing circuit 205 equalizes the voltage at node OUT_SNS to output voltage $V_{OUT} \approx VM$. In amplifier bias circuit 350, the 5V voltage drop ($I_{b1} \cdot R_{346}$) across resistor 346 produces a gate voltage for n-channel transistor 342 that would be 5V above voltage $V_{OUT}$, but which is limited to power supply voltage VM itself in this example ($V_{OUT} = VM$). N-channel transistor 342 is turned on by this gate bias, clamping bias voltage $V_{SUP\_P}$ at the source of transistor 342 to a threshold voltage $V_{tn}$ drop below the gate voltage VM. In this example in which transistor 342 is a native transistor, voltage $V_{SUP\_P}$ at bias node SUP_P is at about VM.

With a 5V voltage drop ($I_{b2} \cdot R_{356}$) across resistor 356, the voltage at the gate of p-channel transistor 352 is 5V voltage below bias voltage $V_{SUP\_P}$, which in this example is at about VM−5V. Transistor 352 is turned on by this gate bias, clamping voltage $V_{SUP\_N}$ at its source to a threshold voltage Vtp above the gate voltage of VM−5V. For a threshold voltage $V_{tp}$ of 1V, the voltage $V_{SUP\_N}$ at bias node SUP_N is thus about VM−4V in this example.

In the example of FIG. 4B in which output voltage $V_{OUT}$ is at the maximum half-bridge output voltage $V_{OUT} = VM$, amplifier bias circuit 350 thus generates a bias of about 4V across amplifier 325. This differential bias is thus about the same as the bias across amplifier 325 for the case of output voltage $V_{OUT}$ at its minimum as shown in FIG. 4A.

Figure 5:
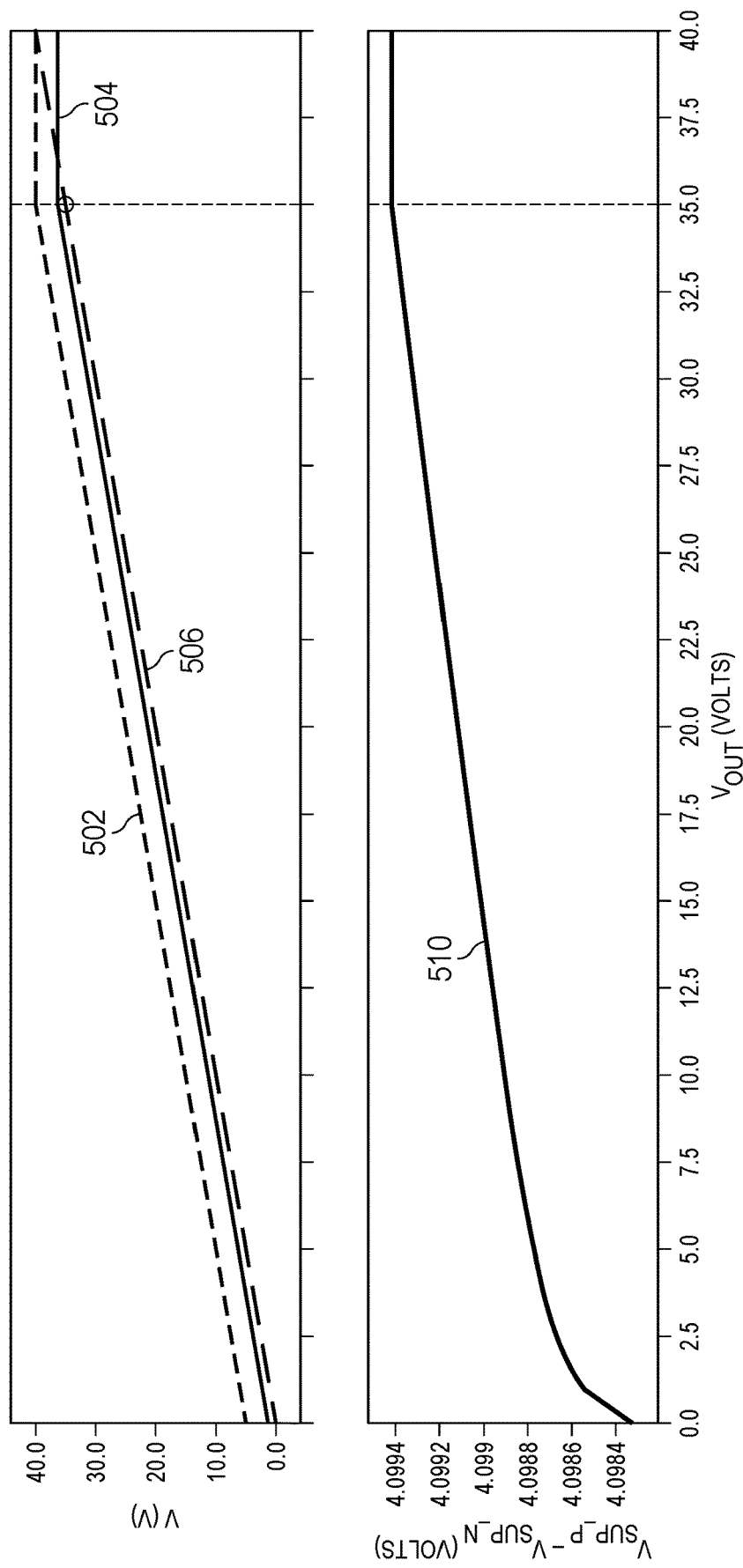
FIG. 5 is an example plot of amplifier bias voltages versus half-bridge driver output voltage in the circuitry of FIG. 3.

The bias across amplifier 325 is thus maintained substantially constant over the range of half-bridge output voltage $V_{OUT}$, as illustrated in FIG. 5. The upper plot of FIG. 5 illustrates an example of the behavior of bias voltages $V_{SUP\_P}$ and $V_{SUP\_N}$ as output voltage $V_{OUT}$ varies from its minimum of 0.0V to a maximum of power supply voltage VM, which in this case is +40.0V. Plot 502 shows that bias voltage $V_{SUP\_P}$ increases with output voltage $V_{OUT}$ (shown by plot 506 as well as the x-axis), maintaining a relatively constant gap with plot 506 until output voltage $V_{OUT}$ reaches about 35V, at which point bias voltage $V_{SUP\_P}$ is limited to power supply voltage VM as described above relative to FIG. 4B.

Plot 504 illustrates the variation of bias voltage $V_{SUP\_N}$ as half-bridge output voltage $V_{OUT}$ increases from 0.0V to its maximum at a power supply voltage VM of +40V. Similarly as bias voltage $V_{SUP\_P}$, bias voltage $V_{SUP\_N}$ increases as output voltage $V_{OUT}$ increases, up to the point ($V_{OUT} \approx 35V$) at which bias voltage $V_{SUP\_P}$ reaches its maximum of power supply voltage VM=40V. As shown in FIG. 5, bias voltage $V_{SUP\_N}$ maintains a relatively constant gap with output voltage $V_{OUT}$ (plot 506) until output voltage $V_{OUT}$ reaches about 35V. Accordingly, amplifier bias circuit 350 in the example of FIG. 3 maintains a relatively constant bias across amplifier 325 (the difference between bias voltage $V_{SUP\_P}$ and bias voltage $V_{SUP\_N}$) throughout the rail-to-rail range of half-bridge output voltage $V_{OUT}$ from circuit ground (0V) to power supply voltage VM (e.g., 40V). Plot 510 in the lower portion of FIG. 5 illustrates bias differential $V_{SUP\_P} - V_{SUP\_N}$ across amplifier 325 for the example of plots 502, 504 in the upper portion of FIG. 5. As shown by plot 510, this bias differential varies only slightly (e.g., on the order of 1 mV) over the rail-to-rail range of output voltage $V_{OUT}$ in this example.

This constant bias across amplifier 325 regardless of output voltage $V_{OUT}$ ensures that voltages internal to amplifier 325 do not significantly vary with variations in output voltage $V_{OUT}$. As a result, excellent common mode rejection ratio (CMRR) can be exhibited by load current sensing circuit 205 according to this example, especially as compared with current sensing circuits in which the amplifier is biased from a charge pump or includes complementary n-channel and p-channel high-voltage input transistors biased from the circuit power supply. In addition, neither of amplifier bias circuit 350 or amplifier 325 in this example requires bias from a charge pumped voltage (e.g., above power supply voltage VM), enabling the efficient implementation of load current sensing circuit 205, 255 in integrated circuit 200, from the standpoint of chip area and power consumption.

Figure 6:
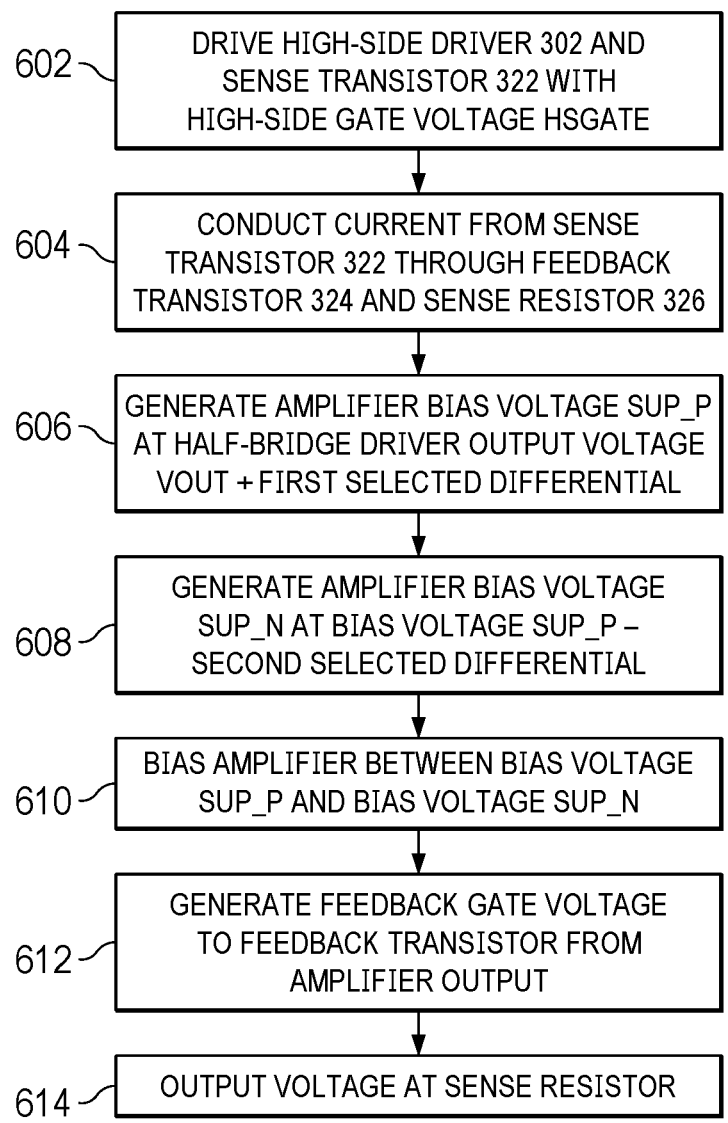
FIG. 6 is an example flow diagram of a method of sensing load current from a half-bridge driver circuit.

FIG. 6 is an example flow diagram of a method of sensing load current from half-bridge driver circuit 202 using load current sensing circuit 205 in the example of FIG. 3 described above. In process block 602, high-side driver 312 drives the gates of high-side power FET 302 and sense transistor 322 with gate drive signal HSGATE at a voltage that turns on both transistors 302, 322. In process block 604, sense transistor 322 in its on-state conducts a current from power supply voltage VM to circuit ground through feedback transistor 324 and sense resistor 326.

Bias voltages SUP_P and SUP_N for amplifier 325 are generated by amplifier bias circuit 350 in process blocks 606 and 608, respectively. In process block 606, amplifier bias circuit 350 generates bias voltage SUP_P corresponding to the output voltage $V_{OUT}$ driven by half-bridge driver circuit 202 plus a first selected differential. In the examples of FIG. 4A and FIG. 4B described above, this first selected differential is a regulated voltage, for example a voltage across resistor 346 conducting a controlled current from current source 344, minus a threshold voltage of transistor 342. In an example, the first selected differential is about 5V. In process block 608, amplifier bias circuit 350 generates bias voltage SUP_N corresponding to bias voltage SUP_P minus a second selected differential. This second selected differential may also be a regulated voltage, for example a voltage across resistor 356 conducting a controlled current from current source 354, plus a threshold voltage of transistor 352.

In process block 610, amplifier 325 in load current sensing circuit 205 is biased between bias voltages SUP_P and SUP_N generated by amplifier bias circuit 350 in process blocks 606 and 608, respectively. Amplifier 325 has a positive input coupled to the output OUT of half-bridge driver 302 and a negative input coupled to node OUT_SNS between sense transistor 322 and feedback transistor 324, as described above. In process block 612, amplifier 325 provides a feedback gate voltage at its output A_OUT to the gate of feedback transistor 324. In this example, a negative feedback loop formed in load current sensing circuit 205 by sense transistor 322, feedback transistor 324, resistor 326, and amplifier 325 regulates the gate voltage of feedback transistor 324 so that the voltage at node OUT_SNS matches output voltage $V_{OUT}$. As a result, the current driven by high-side power FET 302 is mirrored by the current conducted by sense resistor 326 (e.g., scaled by a factor 1/M according to the relative transistor sizes). A voltage at sense resistor 326 corresponding to this current is provided in process block 614. This voltage is a measure of the load current driven by half-bridge driver 202 at output terminal OUT.

According to this example method of FIG. 6, the amplifier bias in a half-bridge driver load current sensing circuit is maintained substantially constant over the output voltage range of the half-bridge driver. Excellent common mode rejection ratio (CMRR) of the load current sensing circuit can be attained as a result, without requiring charge pumped voltages to be applied to the amplifier or its bias circuitry.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device, or other electronics or semiconductor component.

Unless otherwise stated, "about," "approximately," or "substantially" preceding a value means+/−10 percent of the stated value. Modifications are possible in the described examples, and other examples are possible within the scope of the claims.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party. While, in some example embodiments, certain elements are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description.

Modifications are possible in the described examples, and other examples are possible, within the scope of the claims.

What is claimed is:

1. A circuit, comprising:
   a gate driver having an output;
   a sense transistor having a first terminal coupled to a power supply terminal, having a second terminal, and having a gate terminal coupled to the output of the gate driver;
   a feedback transistor having a first terminal coupled to the second terminal of the sense FET, having a second terminal, and having a gate terminal;
   a sense resistor, coupled between the second terminal of the feedback transistor and a reference voltage terminal;
   an amplifier, having a first bias terminal, a second bias terminal, a first input terminal coupled to an output terminal of the circuit, a second input terminal coupled to the second terminal of the sense transistor and the first terminal of the feedback transistor, and having an output coupled to the gate of the feedback transistor; and
   an amplifier bias circuit, comprising:
      a first transistor having a first terminal coupled to the power supply terminal, having a second terminal coupled to the first bias terminal of the amplifier, and having a gate terminal;
      a first current source coupled between the power supply terminal and the gate terminal of the first transistor;
      a first resistor coupled between the gate terminal of the first transistor and the output terminal;
      a second transistor having a first terminal, having a second terminal coupled to the reference voltage terminal, and having a gate terminal;
      a second resistor coupled between the second terminal of the first transistor and the gate terminal of the second transistor; and
      a second current source coupled between the gate terminal of the second transistor and the reference voltage terminal.

2. The circuit of claim 1, wherein the gate driver is a high-side gate driver;
   and further comprising:
      a high-side power transistor having a first terminal coupled to the first power supply terminal, a second terminal coupled to the output terminal, and having a gate terminal coupled to the output of the high-side gate driver;
      a low-side power transistor having a first terminal coupled to the output terminal, a second terminal coupled to the reference voltage terminal, and having a gate terminal;
      a low-side gate driver having an output coupled to the gate terminal of the low-side power transistor.

3. The circuit of claim 1, wherein the amplifier bias circuit further comprises:
   a third resistor coupled between the second terminal of the first transistor and the first terminal of the second transistor.

4. The circuitry of claim 1, wherein the first transistor is a native field-effect transistor (FET).

5. The circuitry of claim 1, wherein the first transistor is an n-channel FET and the second transistor is a p-channel FET.

6. The circuitry of claim 1, further comprising:
   a charge pump circuit having an output coupled to a bias terminal of the first driver.

7. The circuitry of claim 1, wherein the amplifier is a differential operational amplifier, and comprises:
   complementary input transistor pairs coupled to the first and second inputs; and
   a load circuit coupled to the complementary input transistor pairs, and coupled to the output of the amplifier.

8. The circuitry of claim 7, wherein the high-side and low-side power transistors are constructed as high voltage transistors;
   wherein the complementary input transistor pairs of the amplifier are constructed as low voltage transistors;
   and wherein the first and second transistors are constructed as low voltage transistors.

9. The circuitry of claim 1, wherein the high-side power transistor is larger than the sense transistor by a selected ratio.

10. A method of sensing load current from a half-bridge driver circuit, comprising:
    driving a high-side driver and a sense transistor with a gate voltage from a high-side gate driver, the high-side driver and the sense transistor each having a drain coupled to a power supply voltage;
    conducting current from the sense transistor to a reference potential through a feedback transistor and a sense resistor;
    generating a first amplifier bias voltage corresponding to a voltage at an output of the high-side driver plus a first selected differential;
    generating a second amplifier bias voltage corresponding to the first amplifier bias voltage minus a second selected differential;
    biasing an operational amplifier from the first and second amplifier bias voltages;
    generating a feedback gate voltage to the feedback transistor from an output of the operational amplifier, the operational amplifier having a positive input coupled to a half-bridge driver output and a negative input coupled to a node between the sense transistor and the feedback transistor; and
    outputting a voltage at the sense resistor.

11. The method of claim 10, wherein the step generating the first amplifier bias voltage comprises:
    generating a first gate voltage by conducting a first current from the driver power supply voltage through a first resistor to the half-bridge driver output; and
    applying the first gate voltage to a gate of a first transistor coupled between the driver power supply voltage and a first bias terminal of the operational amplifier;
    and wherein the step of generating the second amplifier bias voltage comprises:
    generating a second gate voltage by conducting a second current from the half-bridge driver output through a second resistor to the reference potential; and
    applying the second gate voltage to a gate of a second transistor coupled between the reference potential and a second bias terminal of the operational amplifier, the second transistor coupled to the first transistor through a third resistor.

12. The method of claim 10, further comprising:
    driving a low-side driver with a gate voltage from a low-side gate driver in a non-overlapping manner with the driving of the high-side driver.

13. The method of claim 10, further comprising:
    generating a charge pump voltage higher than the power supply voltage; and
    biasing the high-side gate driver with the charge pump voltage.

14. The method of claim 10, wherein, during the driving step, the current conducted from the sense transistor is a selected fraction of the sensed load current.

15. A load current sensing circuit, comprising:
- a high-side gate driver, having an output;
- a sense leg including a sense transistor, a feedback transistor, and a sense resistor coupled in series between a power supply voltage and a reference voltage, the sense transistor having a gate coupled to the output of the high-side gate driver;
- an operational amplifier having first and second bias voltage terminals, having a first input coupled to the sense leg, having a second input coupled at an output terminal, and having an output coupled to a gate of the feedback transistor;
- an amplifier bias circuit, comprising:
  - a first leg configured to generate a first gate voltage at a first differential from a voltage at the output terminal;
  - a first transistor, coupled between the power supply voltage and the first bias voltage terminal, and having a gate receiving the first gate voltage from the first leg;
  - a second leg configured to generate a second gate voltage at a second differential from a voltage at the first bias voltage terminal;
  - a second transistor, coupled between the reference potential and the second bias voltage terminal, and having a gate receiving the second gate voltage from the second leg; and
  - a third resistor coupled between the first and second bias voltage terminals.

16. The circuit of claim 15, wherein the first transistor is a native transistor.

17. The circuit of claim 15, wherein the first transistor is an n-channel field-effect transistor (FET) and the second transistor is a p-channel FET.

18. The circuit of claim 15, further comprising:
- a charge pump circuit having an output coupled to a bias terminal of the high-side gate driver.

19. The circuit of claim 15, wherein the operational amplifier is a differential amplifier, and comprises:
- complementary input transistor pairs coupled to the first and second inputs; and
- a load circuit coupled to the complementary input transistor pairs, and coupled to the output of the operational amplifier.

20. The sense circuit of claim 15, further comprising:
- a high-side gate driver, having an output coupled to a low-side output terminal.

* * * * *